United States Patent [19]

Young

[11] 4,018,979
[45] Apr. 19, 1977

[54] SPLIT SHELL CONNECTOR ACCESSORY FOR ELECTRICAL CABLES

[75] Inventor: Thomas F. Young, Burbank, Calif.

[73] Assignee: Sunbank Electronics, Inc., Burbank, Calif.

[22] Filed: Dec. 22, 1975

[21] Appl. No.: 643,523

[52] U.S. Cl. .............................. 174/35 C; 174/92; 285/179; 285/373; 339/143 R

[51] Int. Cl.² .................................................. H05K 9/00

[58] Field of Search ............... 285/373, 419, 179; 174/92, 87, 35 C; 339/143 R, 141

[56] References Cited

UNITED STATES PATENTS

| | | | |
|---|---|---|---|
| 881,022 | 3/1908 | Nailler | 285/179 |
| 1,083,756 | 1/1914 | Phelps | 285/179 X |
| 1,369,913 | 3/1921 | Brunhoff | 285/373 X |
| 2,094,258 | 9/1937 | Thompson | 285/373 X |
| 2,958,546 | 11/1960 | Lee | 285/373 X |
| 3,153,550 | 10/1964 | Hollett | 285/179 |
| 3,206,229 | 9/1965 | Kramer | 285/373 X |
| 3,466,069 | 9/1969 | Hoke et al. | 285/373 X |
| 3,614,298 | 10/1971 | Thompson | 174/92 |
| 3,672,613 | 6/1972 | Oriani | 285/373 X |
| 3,796,823 | 3/1974 | Wright et al. | 174/92 |

*Primary Examiner*—Thomas F. Callaghan
*Attorney, Agent, or Firm*—Robert C. Comstock

[57] ABSTRACT

A split shell connector accessory for electrical cables comprising a pair of shell halves having a passage therethrough for receiving and holding a cable. An adapter is mounted at each end of the passage. One shell half has an elastomeric sealing member extending continuously along each side of the cable holding passage and the other shell half has a complementary groove. Each adapter has an O-ring which fits into complementary grooves in the adapters. The O-rings extend in a plane transverse to the plane of the elastomeric sealing members. When the shell halves are tightened together, the adjacent portions of the elastomeric members and O-rings are compressed into engagement with each other to form a complete environmental seal. Complementarily engaging ridges and grooves on the shell halves and adapters provide complete RFI/EMI (radio frequency interference/electromagnetic interference) shielding.

5 Claims, 7 Drawing Figures

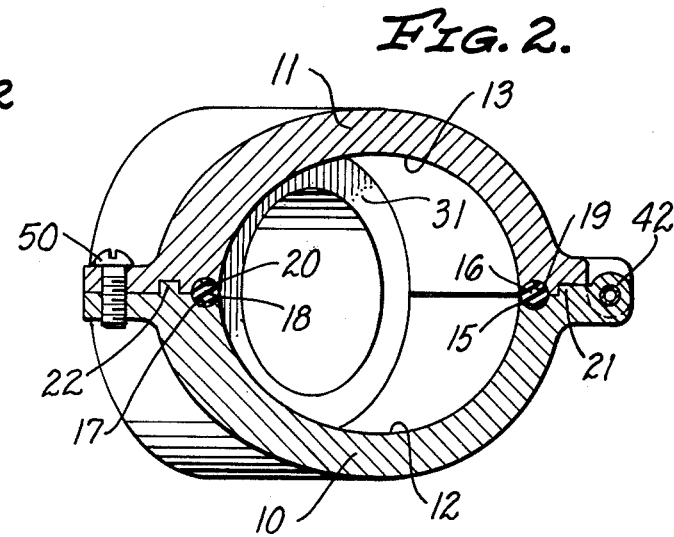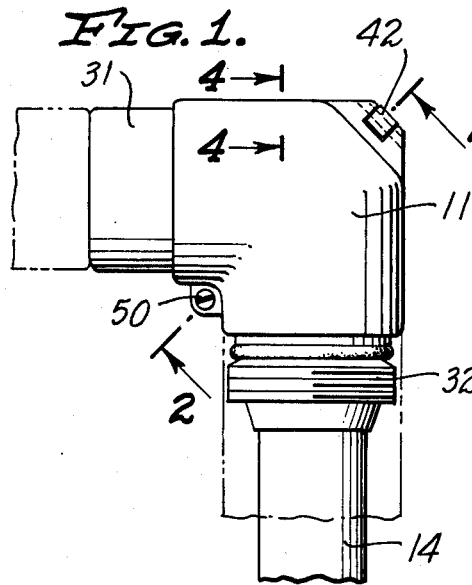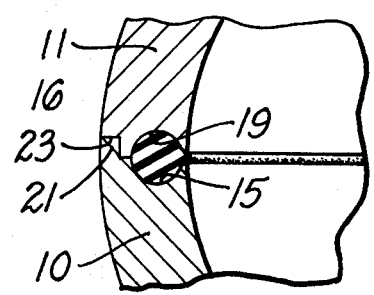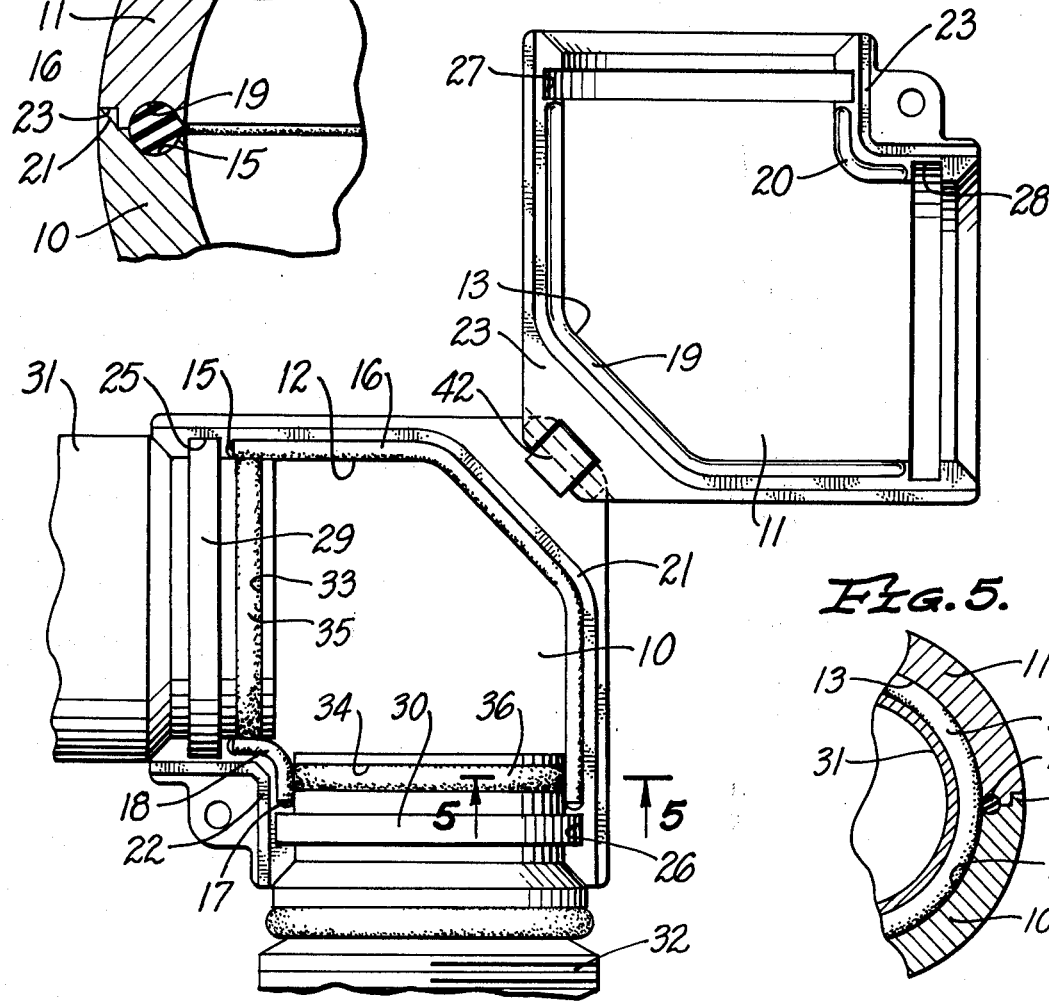

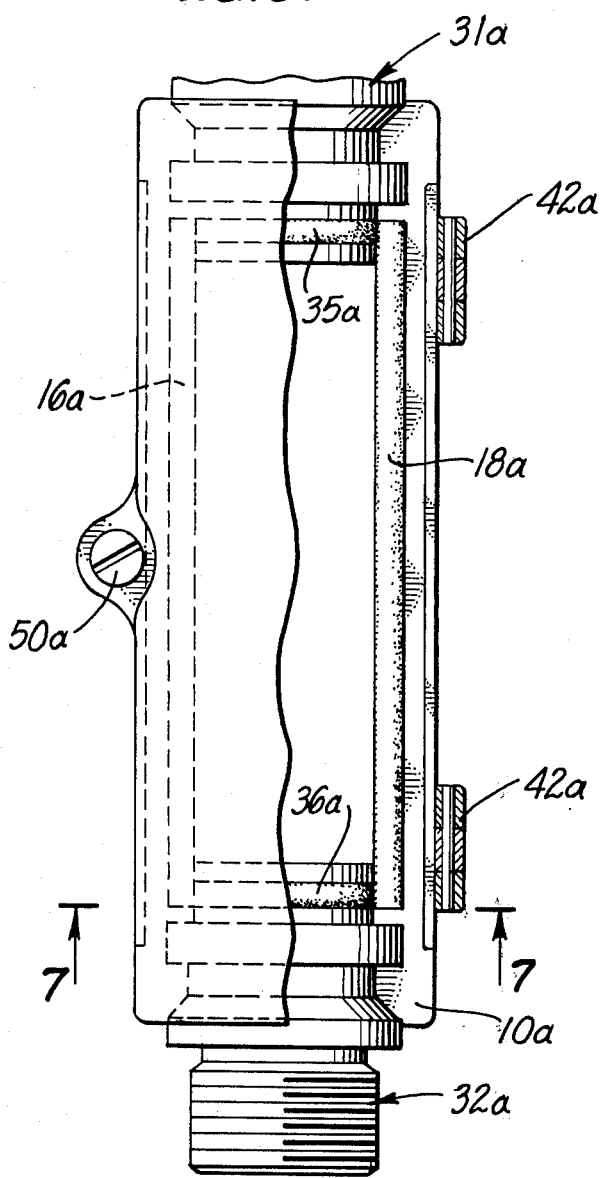
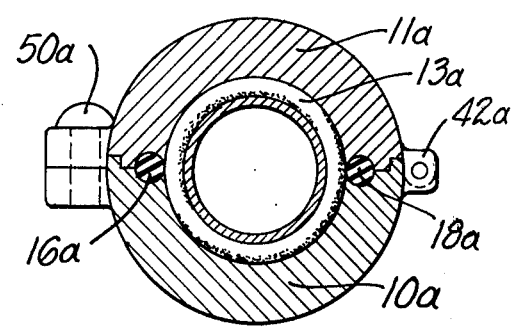

SPLIT SHELL CONNECTOR ACCESSORY FOR ELECTRICAL CABLES

BACKGROUND OF THE INVENTION

1. Field of the Invention

The invention relates to a split shell connector accessory for electrical cables which provides a complete environmental seal and radiation shielding.

2. Description of the Prior Art

In the past, electrical connector accessories which require a perfect environmental seal have been made of a solid shell because it has heretofore been considered impossible to provide a complete environmental seal in a split shell accessory.

A solid or closed shell connector accessory has a number of disadvantages compared with a split shell. In the case of any accessory other than one extending in a straight line, it becomes difficult to thread the cable assembly through the accessory. This is particularly true if the accessory extends at a 90° angle, as is required in many applications.

Connector accessory installations are governed by military and commercial requirements which provide limited working space for terminating multi-conductor electrical cables. Permanently molding or potting of the connector/cable interface has often been used to provide an environmental seal, but such an assembly is for all practical purposes unrepairable.

Solid back shells are difficult to slide up cables for repair purposes, particularly when the back shell is bent at an angle such as 90° low profile elbow.

SUMMARY OF THE INVENTION

The invention provides a split shell connector accessory for electrical cables which furnishes a perfect environmental seal. The accessory is also capable of simultaneously providing complete RFI/EMI shielding as well.

In essence, the invention contemplates providing an elongated elastomeric sealing member of circular cross-section which extends along the entire periphery of the accessory except for a circular opening at each end of the accessory through which the cable extends. The assembly includes adapters which fit into these cable receiving openings. The portions of the adapters disposed within the openings are provided with annular elastomeric members in the nature of static O-rings.

The peripheral and circular elastomeric members are constructed and arranged so that when the connector parts are closed, the O-rings and peripheral sealing members are disposed at right angles to each other and are compressed into sealing engagement with each other to provide a complete environmental seal of the accessory.

The accessory may also include an RFI/EMI shielding closure, which extends around the entire periphery of the accessory, preferably somewhat outwardly from the environmental seal.

Connector accessories formed in accordance with the invention may extend in a straight line or may extend at any desired angle, including a 90° angle. In angular applications, the accessory of the present invention is particularly advantageous because it makes installation of the cable far simpler. The cable need merely be laid inside the open split shell instead of being passed through a closed shell.

An outstanding advantage of the accessory of the present invention is that it can easily be opened for inspection, repair or replacement purposes and then closed again without any delay or difficulty. No sealing compounds or the like are ever used, so none need be removed or replaced. The environmental seal and the RFI/EMI shielding closure remain as intact and as complete after the repair operations as before. Disassembly, repair or replacement and re-assembly can all be easily accomplished without disconnecting the cable terminations, without totally disassembling the accessory from the back shell and without adversely affecting other accessory functions.

The invention further makes possible a more compact and lower profile assembly than has heretofore been possible with solid or closed accessories.

It is accordingly among the objects of the present invention to provide a connector accessory which overcomes the problems and deficiencies of the prior art and which has all of the advantages and benefits set forth above and described in further detail hereinafter in this specification.

It is an object of the invention to provide a split shell connector accessory which has an environmental seal which automatically re-establishes itself upon opening and closing of the shell.

Another object of the invention is to provide such a connector assembly which has complete RFI/EMI shielding as well.

A further object of the invention is to provide such a connector accessory which is adaptable for use in low profile 90° elbow configurations.

The invention also comprises such other objects, advantages and capabilities as will later more fully appear and which are inherently possessed by the invention.

While there are shown in the accompanying drawings preferred embodiments of the invention, it should be understood that the same are susceptible of modification and change without departing from the spirit of the invention.

DESCRIPTION OF THE DRAWINGS

FIG. 1 is a top plan view of a right angular split shell connector accessory in closed position;

FIG. 2 is a sectional view of the same taken on line 2—2 of FIG. 1;

FIG. 3 is a top plan view of the accessory of FIG. 1 in open position;

FIG. 4 is an enlarged partial sectional view of one edge of the accessory in closed position;

FIG. 5 is a sectional view taken on line 5—5 of FIG. 3;

FIG. 6 is a top plan view of another embodiment, a straight connector assembly, shown in closed position, partly broken away to show the interior structure;

FIG. 7 is a sectional view of the same taken on line 7—7 of FIG. 6.

DESCRIPTION OF THE PREFERRED EMBODIMENT

A preferred embodiment which has been selected to illustrate the invention comprises a split shell accessory having a lower half 10 and an upper half 11. The halves 10 and 11 may be completely separate or may be joined by a hinge 42 or other mechanical connection. This particular embodiment of accessory comprises a 90° elbow.

The interior of the accessory halves 10 and 11 is provided with complementary right angular passages 12 and 13, which combine to form a passage of substantially circular cross section which is adapted to receive and fit around the outside of a multi-conductor cable 14.

Extending along the outer periphery of the passage 12 of the lower half 10 is a continuous groove 15 of arcuate cross section. The groove 15 has three straight sections. A continuous elastomeric member 16 of circular section is fixedly mounted by adhesive or other suitable means within the groove 15. The inner periphery of the passage 12 has a similar shorter groove 17, within which is fixedly mounted a short arcuate elastomeric member 18 of circular cross section.

The upper half 11 is provided with a complementarily formed long groove 19 and short groove 20, which are aligned with and dimensioned to fit around the elastomeric members 16 and 18 when the halves 10 and 11 of the shell are closed.

The lower half 10 is provided on one side thereof outwardly from the elastomeric member 16 with a continuous metallic ridge 21, which extends continuously from one edge of the lower half 10 to the other in three sections, the end sections being longer than those of the elastomeric member 16. The opposite side of the lower half 10 is provided with a right angular ridge 22, which extends from one edge of the lower half 10 to the other. The ridge 22 is disposed outwardly from the elastomeric member 18 and is of much greater length.

The upper half 11 of the shell is provided with a continuous recess 23 of L-shaped cross section which is disposed outwardly from the groove 19. The recess 23 is formed complementarily to and aligned with the ridge 21 and is adapted to receive the ridge 21 when the shell is closed. The opposite side of the upper half 11 is provided with a right angular recess 24 which is formed complementarily to and aligned with the right angular ridge 22 and is adapted to receive the ridge 22 when the shell is closed.

The lower half 10 is provided adjacent to the opposite ends of the passage 12 with a pair of semi-circular relatively wide channels 25 and 26 respectively, which are substantially square in cross section. The channels 25 and 26 are disposed outwardly beyond the opposite ends of the elastomeric members 16 and 18. The upper half 11 has a pair of identically formed aligned channels 27 and 28.

The channels 25–28 are adapted to combine and form a complete circle when the shell is closed. They fit around annular flanges 29 and 30 of square cross section which are formed on the exterior of a pair of adapters 31 and 32. The inner ends of the adapters 31 and 32 are provided with grooves 33 and 34 in which are mounted a pair of elastomeric O-rings 35 and 36.

When the adapters 31 and 32 have their flanges 29 and 30 disposed within the recesses 25–28 of the shell, the O-rings 35 and 36 are disposed at right angles to and are in engagement with the end portions of the elastomeric members 16 and 18. The engagement between the flanges 29 and 30 and channels 25–28 provides RFI/EMI shielding and prevents any substantial displacement or movement of the adapters 31 and 32 with respect to the shell halves 10 and 11. This may be reinforced by beveled portions on the adapters which engage complementary beveled portions on the shell halves.

In use, the shell halves 10 and 11 are first moved to open position. The portion of the cable 14 adjacent to the end to be terminated is easily laid in the bottom half 10, being bent at substantially a right angle to follow the contour of the passage 12. The cable 14 extends through openings in the adapters 31 and 32. The structure beyond the adapters 31 and 32 is not shown or described because it does not constitute part of the present invention.

The upper half 11 of the shell is moved over the lower half 10 which contains the cable 14 and over the upper portions of the adapters 31 and 32. A threaded fastening member 50 or other suitable means is then used to apply pressure to move the shell halves 10 and 11 tightly into engagement with each other.

When the shell halves 10 and 11 are fully tightened together, the flanges 29 and 30 engage the inner ends of the channels 25–28 to provide a mechanical stop. At this point, there is still an opening of 0.010 to 0.020 inches between the edges of the halves 10 and 11 adjacent to the elastomeric members 16 and 18.

As the shell halves 10 and 11 are closed, they cause a limited amount of compression and controlled displacement of the elastomeric members 16 and 18, urging them toward and into tighter sealing engagement with the adjacent portions of the O-rings 35 and 36. At the same time, the O-rings 35 and 36 are likewise subjected to a substantial amount of compression and controlled displacement by their engagement with the adjacent portions of the passages 12 and 13. The O-rings 35 and 36 are thereby urged toward and into tighter sealing engagement with the adjacent end portions of the elastomeric members 16 and 18.

The amount of pressure applied to the elastomeric members 16 and 18 and the O-rings 35 and 36 is preferably such as to provide optional compression of between 14 and 28%. Less than this amount is likely to provide insufficient displacement to form a perfect seal. More than this amount may cause the elastomeric material to fail, particularly by cold flowing into a distorted configuration.

The material used to form the elastomeric members 16 and 18 and the O-rings 35 and 36 preferably has a Shore hardness of approximately 60 and should preferably be in the range between 40 and 90.

The environmental seal formed is capable of withstanding pressure, external or internal, of up to at least 5 atmospheres without leakage. The elastomeric members 16 and 18 and the O-rings 35 and 36 accordingly combine to provide a complete environmental seal for the split shell portion of the accessory. This seal may be broken as often as necessary to permit inspection, repair, replacement, etc., and the seal is automatically re-established when the accessory is closed and the halves tightened together.

The ridges 21–22 and recesses 23–24 also become tightly engaged and extend around the entire periphery of the split shell portion of the accessory to provide a complete RFI/EMI shield.

The accessory may be formed in any desired configuration. It may extend at any angle, a 90° angular accessory having been selected first for illustration in the drawings. The accessory may also extend in a straight line, as shown in FIGS. 6–7 of the drawings. In this embodiment of the invention, substantially identical parts are used and identified by identical reference numerals, with the addition of the letter *a*. The elastomeric members 16*a* and 18*a* extend in a straight line, as do the ridges 21a–22a and recesses 23a–24a. The adapters 31a and 32a are identical with the adapters 31 and 32, and the O-rings 35a and 36a are identical with the O-rings 35 and 36.

I claim:

1. A split shell connector accessory for electrical cables comprising a pair of complementarily formed shell halves having a passage extending therethrough for receiving and holding a cable, one of said shell halves having an elastomeric sealing member extending continously along each side of said cable holding passage, an adapter mounted at each end of said passage, each of said adapters having an annular resilient member extending therearound, said resilient members extending in a plane transverse to the plane of said elastomeric sealing members, said shell halves having complementarily formed ridges and grooves extending continuously along each side of said passage adjacent and in the same plane as said sealing members, and said adapters and shell halves having complementarily formed annular flanges and channels extending therearound adjacent to and in the same plane as said resilient members, and means for tightening said shell halves into engagement with each other, whereby the adjacent portions of said elastomeric members and resilient members are compressed into engagement with each other and said elastomeric members are compressed into engagement with the other of said shell halves to form an environmental seal and said ridges and grooves and said flanges and channels are respectively simultaneously engaged with each other to form a RFI/EMI shield, said environmental seal and said shield extending completely around the periphery of said passage and the cable portion disposed within said passage.

2. The structure described in claim 1, said accessory having a right angular configuration, and hinge means connecting said shell halves together for pivotal movement between open and closed positions, said hinge means being disposed along the outer corner of said accessory.

3. The structure described in claim 1, the other of said shell halves having a groove extending continuously along each side of said cable holding passage, said grooves being aligned with and formed complementarily to said elastomeric sealing members when said shell halves are tightened into engagement with each other, each of said shell halves having a semi-circular groove extending around its interior at each end thereof, said grooves being aligned to form circular grooves complementary to said resilient members for receiving and compressing said resilient members when said shell halves are tightened into engagement with each other.

4. The structure described in claim 3, said structure being constructed and arranged so that said elastomeric members and resilient members are compressed in a range of approximately 14–28%.

5. The structure described in claim 3, said elastomeric members and resilient members having a Shore hardness of approximately 40–90 and said structure being constructed and arranged so that said elastomeric members and resilient members are compressed in a range of approximately 14–28%.

* * * * *